United States Patent
Dierickx et al.

(10) Patent No.: US 7,333,040 B1
(45) Date of Patent: Feb. 19, 2008

(54) FLASH ADC WITH SPARSE CODES MATCHED TO INPUT NOISE

(75) Inventors: Bart Dierickx, Edegem (BE); Gerald Lepage, Wavre (BE); Tomas Geurts, Haasrode (BE)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/443,680

(22) Filed: May 30, 2006

Related U.S. Application Data

(60) Provisional application No. 60/685,117, filed on May 27, 2005.

(51) Int. Cl.
 *H03M 1/00* (2006.01)
(52) U.S. Cl. ...................... 341/138; 341/120
(58) Field of Classification Search ................ 341/138, 341/120; 348/222.1
 See application file for complete search history.

(56) References Cited

U.S. PATENT DOCUMENTS 3,646,548 A * 2/1972 Van Doren ................. 341/138
7,046,179 B1 * 5/2006 Taft et al. ................... 341/120
7,116,360 B2 * 10/2006 Shiohara .................. 348/222.1

OTHER PUBLICATIONS

Dierickx, Bart, "Non-linear AD conversion, tolerant for pixel offset errors", IMEC, Apr. 21, 1999, 3 pages.

* cited by examiner

*Primary Examiner*—Rexford Barnie
*Assistant Examiner*—Joseph Lauture
(74) *Attorney, Agent, or Firm*—Blakely, Sokoloff, Taylor & Zafman LLP

(57) ABSTRACT

An analog-to-digital converter (ADC) architecture to implement a non-linear flash ADC. The apparatus includes a non-linear resistor, a non-linear comparator, and an inverse non-linear encoder. The non-linear resistor has an input and a plurality of non-linear voltage outputs. The non-linear comparator ladder is coupled to the plurality of non-linear voltage outputs of the non-linear resistor. The non-linear comparator ladder includes a bank of comparators to compare an input signal to each of a plurality of non-linear voltage signals corresponding to the plurality of non-linear voltage outputs. The inverse non-linear encoder is coupled to the non-linear comparator ladder. The inverse non-linear encoder generates a digital output code based on the input signal and the plurality of non-linear voltage signals.

14 Claims, 9 Drawing Sheets

FLASH ADC WITH SPARSE CODES MATCHED TO INPUT NOISE

RELATED APPLICATIONS

This application claims the benefit of U.S. Provisional Application No. 60/685,117, filed on May 27, 2005.

TECHNICAL FIELD

This invention relates to electronic circuits and, in particular, to a non-linear flash analog-to-digital converter (ADC).

BACKGROUND

Image detection circuits are widely used in digital image capture applications, such as digital photography, medical imaging, industrial imaging (process control), aerospace and military imaging, and consumer applications. For example, many consumer electronics such as camcorders, cellphone cameras, security cameras, web cameras, and toys use image detection circuits to capture an electronic representation of an image.

Image detection circuits, or imagers, convert analog signals into digital signals. Imagers often include an analog-to-digital converter (ADC) to perform this conversion. One type of conventional ADC is a flash ADC. A flash ADC is also known as a parallel ADC because it converts a single analog input voltage into a multi-bit digital output signal. For example, an analog input voltage may be converted into an 8-bit or a 10-bit digital output signal. Flash ADCs are widely used in many applications because they are relatively fast, simple, and robust. In particular, many imagers use conventional flash ADCs in applications which benefit from a relatively large bandwidth.

FIG. 1 illustrates a conventional flash ADC architecture used in conventional image sensors. The conventional flash ADC architecture includes an input line coupled to a comparator ladder. The comparator ladder includes a bank of comparators. Each of the comparators compares the input voltage signal from the input line to a voltage signal from the linear resistance ladder. The linear resistance ladder, which is typically a layer of metallic trace or an arrangement of individual resistors, produces a plurality of voltages between two voltages, $V_1$ and $V_2$, applied at the ends of the linear resistance ladder. For example, if $V_1$ is 1.0 Volt and $V_2$ is 2.0 Volts, the linear resistance ladder would generate linearly distributed voltage signals at a plurality of outputs, which are coupled to the comparators. An output in the middle of the voltage resistance ladder would be approximately 1.5 Volts, while outputs closer to $V_1$ would be between 1.0 and 1.5 Volts, and outputs closer to $V_2$ would be between 1.5 and 2.0 Volts. The outputs are evenly distributed along the distance of the linear resistance ladder to facilitate the linear voltage signals.

The comparator ladder receives the input from the imager and the linear voltage signals from the resistance ladder to produce a thermometer code. The thermometer code is a binary code which corresponds to the voltage level on the input line. In particular, the thermometer code outputs ones for all of the comparators which receive linear voltage signals at or below the input voltage, and outputs zeros for all of the comparators which receive linear voltage signals above the input voltage (like a mercury thermometer which has mercury at and below the temperature marking, and no mercury above the temperature marking). For example, if $V_1$ is 1.0 Volts, $V_2$ is 2.0 Volts, and the input voltage is 1.8 Volts, all of the comparators which receive linear voltages between 1.0 and 1.8 Volts would output ones, while the remaining comparators which receive linear voltages between 1.8 and 2.0 Volts would output zeros. The thermometer code is then input to a linear encoder which converts the thermometer code to a digital output signal such as a Gray code or a binary code.

The resolution (i.e., number of bits) of the digital output signal corresponds to the number of comparators in the comparator ladder and the distribution of the linear voltages from the linear resistance ladder. For example, a 10-bit digital output signal from a conventional flash ADC uses 1,024 (i.e., $2^{10}$) comparators and a corresponding number of linear voltage signals. If the linear resistance ladder has a 1.0 milliVolt step between consecutive voltage signals, then the digital output signal would represent an analog input range of about 1.0 Volts.

However, conventional flash ADC circuits have some disadvantages. Specifically, conventional flash ADCs are relatively large (i.e., they consume a relatively large area of the die). Flash ADCs also consume a lot of power. For these reasons, flash ADCs are of limited use in mobile applications which are sensitive to size and power consumption constraints. As a tradeoff, some applications use flash ADCs that have a lower resolution (i.e., less bits in the digital output signal), which offer lower quality in the captured image.

BRIEF DESCRIPTION OF THE DRAWINGS

The present invention is illustrated by way of example, and not by way of limitation, in the figures of the accompanying drawings.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Embodiments of an apparatus are disclosed. One embodiment of the apparatus is an analog-to-digital converter (ADC) architecture. Another embodiment of the apparatus includes a non-linear resistor, a non-linear comparator ladder, and an inverse non-linear encoder. The non-linear resistor has at least one input and a plurality of non-linear voltage outputs. The non-linear comparator ladder is coupled to the plurality of non-linear voltage outputs of the non-linear resistor. The non-linear comparator ladder includes a bank of comparators to compare an input signal to each of a plurality of non-linear voltage signals corresponding to the plurality of non-linear voltage outputs. The inverse non-linear encoder is coupled to the non-linear comparator ladder to generate a digital output code. The digital output code is based on the input signal and the plurality of non-linear voltage signals. Other embodiments of the apparatus may include fewer or more components and may be arranged in an alternative manner.

Embodiments of a method are also disclosed. In one embodiment, the method includes receiving an input signal associated with an image sensor readout, comparing the input signal with each of a plurality of non-linear voltage signals, and generating a digital output code based on the input signal and the plurality of non-linear voltage signals. Another embodiment of the method also may include generating a non-linear thermometer code based on the comparison of the input signal with each of the plurality of non-linear voltage signals. Another embodiment of the method also may include generating the plurality of non-linear voltage signals from a non-linear resistance ladder.

Figure 1:
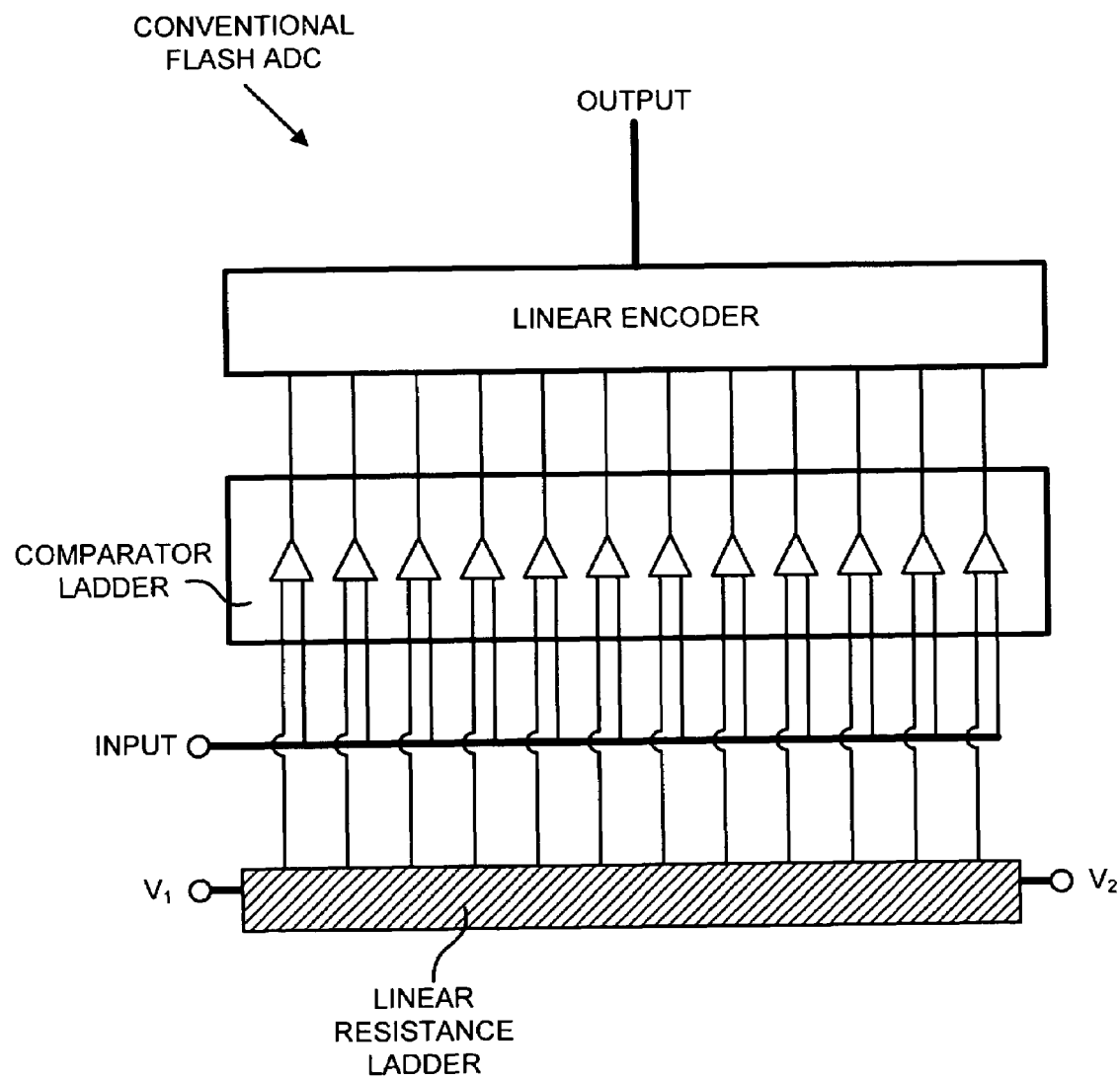
FIG. 1 illustrates a conventional flash ADC architecture used in conventional image sensors.
Figure 2:
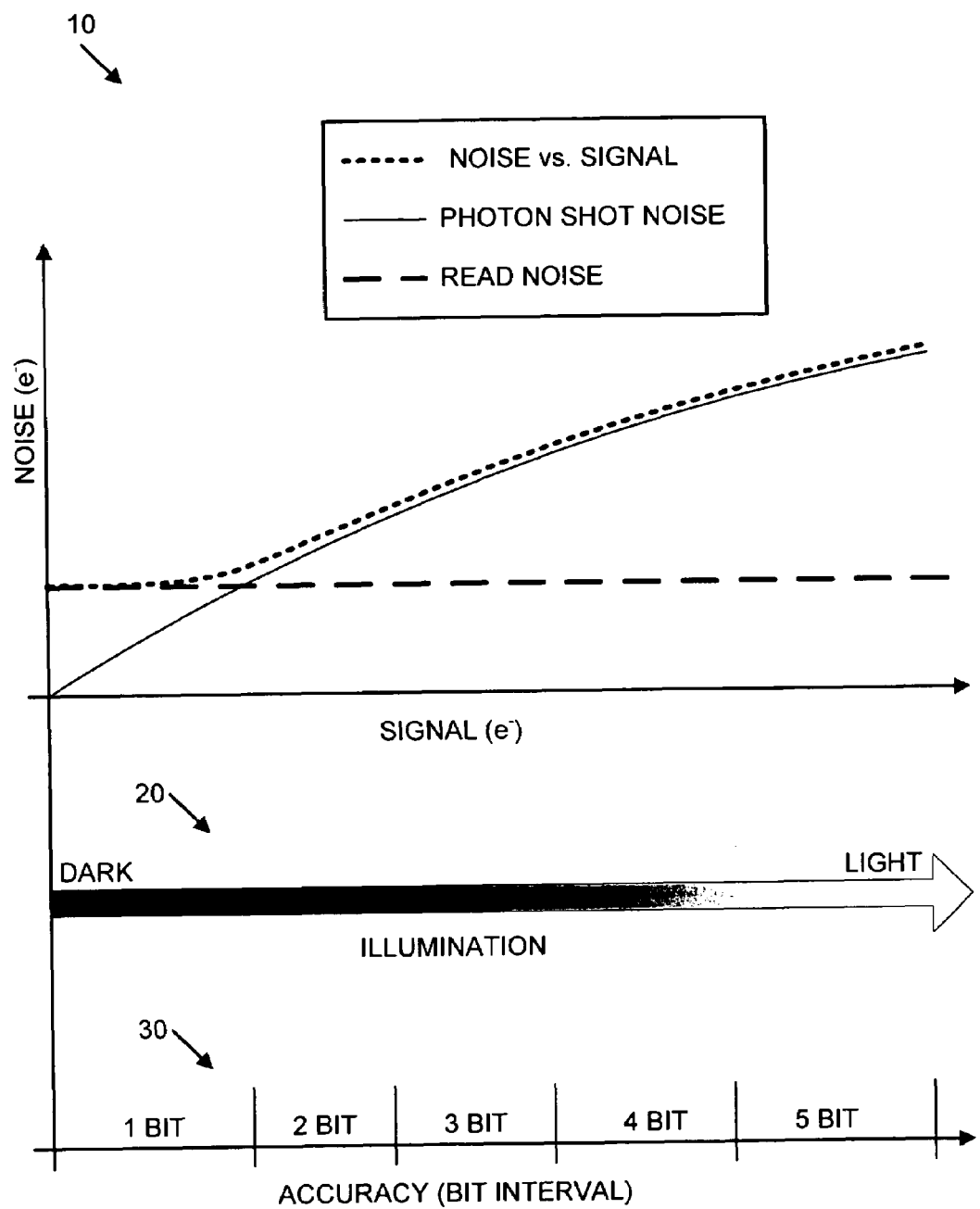
FIG. 2 illustrates a graph of image sensor noise and signal quality.

FIG. 2 illustrates a graph 10 of image sensor noise and signal quality. Illumination 20 is also provided as a reference for the image sensor noise and signal quality to show how the image sensor noise and signal quality changes depending on the level of detected illumination 20.

In regard to the image sensor noise, there are generally two types of noise, read noise and photon shot noise, although other noise may be present. The read noise is relatively constant over the different levels of illumination 20. Although the read noise is typically small, the read noise dominates the noise signal in dark parts of the image. In brighter parts of the image, the photon shot noise dominates. The photon shot noise originates from the quantization of the detection of light (i.e., photons) and increases at approximately the square root of the signal itself.

In one example, the total noise in the dark parts of an image is about 1 $mV_{RMS}$, on a signal range of 1,000 mV. Thus, the signal to noise ratio (1,000 mV/1 mV) in the dark part of the image justifies a 10 bit ADC because approximately 1,000 quantization levels would be detectable in spite of the noise. However, the total noise in the bright parts of the image does not justify the same accuracy. The total noise in bright parts of the image is about 10 $mV_{RMS}$. Since the signal to noise ratio (1,000 mV/10 mV) is lower for bright parts than for dark parts of the image, an ADC with much lower resolution (e.g., a 7 bit ADC) would be suitable because there are fewer quantization levels due to the increased noise. In one embodiment, the ADC resolution in the bright part could be as low as 1/10th of the resolution in the dark part, (e.g., about 6.7 bits). In between these two extremes, the local resolution may continuously vary to match the total noise and, in particular, the photon shot noise.

In another perspective, the lower signal to noise ratio in the bright parts of the image allows quantization levels to be more spread out because quantization levels separated by less than the total noise would be virtually indistinguishable. For example, if a 10 bit ADC were employed for the dark parts of an image, the accuracy of the ADC would be about 1 bit because each bit would be distinguishable from adjacent bits. However, if the same 10 bit ADC were employed for the bright parts of the image, the accuracy of the ADC would be 10 bits because different illumination levels would only be distinguishable at about 10 bit intervals. To illustrate this point, the accuracy 30 of an exemplary ADC is illustrated as it relates to the illumination 20 of the image. In particular, the accuracy 30 decreases as the illumination 20 increases. Given that the bit interval is one representation of the accuracy 20, and the bit interval increases as the accuracy 20 decreases, the bit interval increases as the illumination 20 increases.

Figure 3:
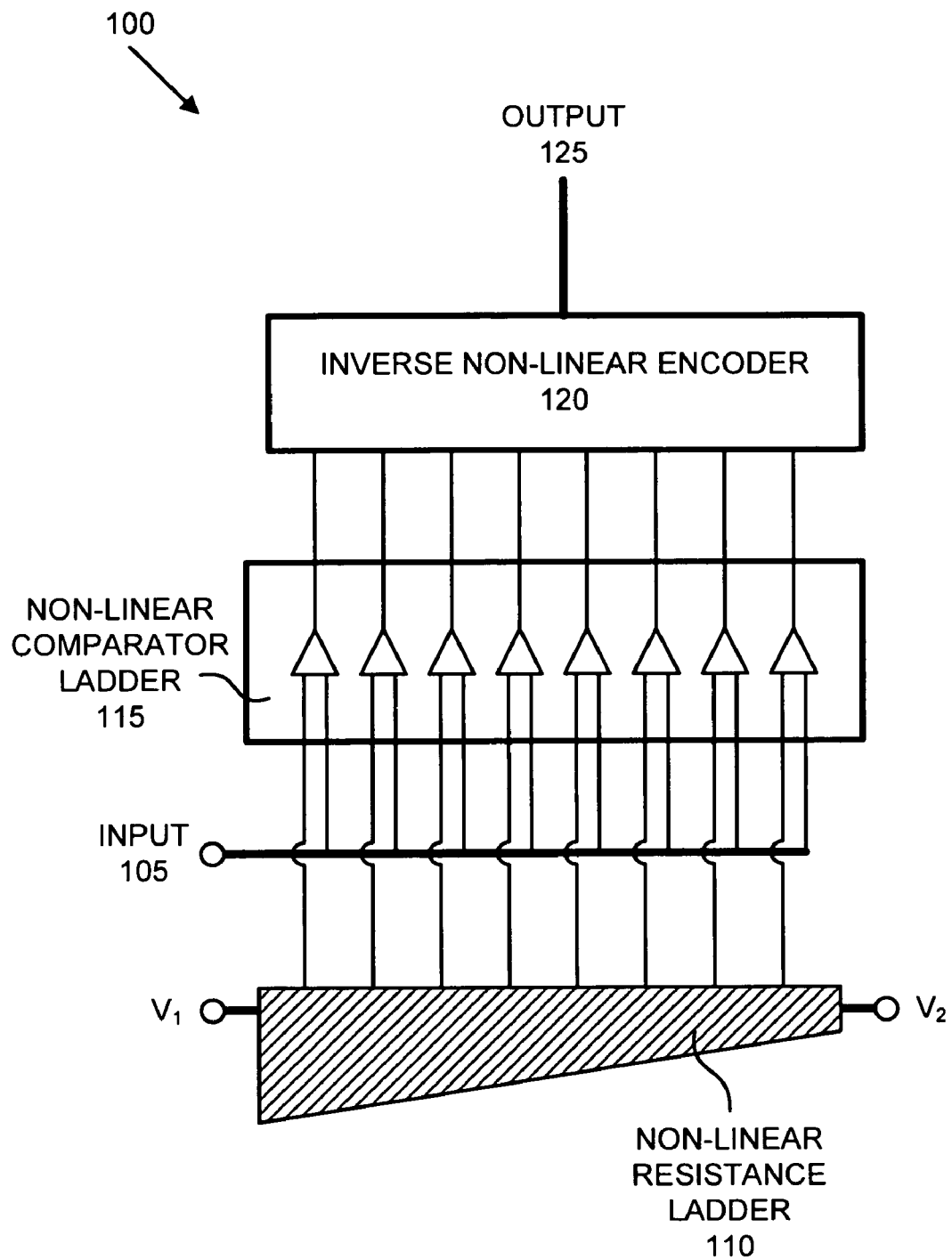
FIG. 3 illustrates one embodiment of a non-linear flash ADC.

FIG. 3 illustrates one embodiment of a non-linear flash ADC 100. The depicted non-linear flash ADC 100 is suitable for use in image sensor applications, as well as other flash ADC applications. The non-linear flash ADC 100 includes an input 105, a non-linear resistor ladder 110, a non-linear comparator ladder 115, an inverse non-linear encoder 120, and an output 125. In one embodiment, the non-linear flash ADC 100 consumes substantially less area and power than a conventional flash ADC.

The input 105 receives an input voltage from an image sensor (not shown) such as a photodiode. The input voltage relates to the amount of light incident on the image sensor. In one embodiment, a low level of incident light (e.g., dark) results in a relatively small input voltage, and a high level of incident light (e.g., bright) results in a relatively large input voltage. The input voltage on the input 105 is relayed to the inputs of each of the comparators in the non-linear comparator ladder 115.

The non-linear resistor ladder 110 generates a plurality of non-linear voltages between the two input voltages, $V_1$ and $V_2$. In one embodiment, the physical geometry of the non-linear resistor ladder 110 determines the voltages generated by the non-linear resistor ladder 110. In one embodiment, the generated voltages may increase exponentially. In another embodiment, the generated voltages may increase in another non-linear manner. For example, the generated voltages may increase linearly for a first portion, then linearly at a distinct linearity for a second portion, so that the combined generated voltages are distinct, linear portions (i.e., multi-linear or piecewise linear). The non-linear voltages generated by the non-linear resistance ladder 110 are input to the corresponding comparators of the non-linear comparator ladder 115.

In one embodiment, the non-linear comparator ladder 115 compares the input voltage on the input 105 to each of the non-linear voltages from the non-linear resistance ladder 110. The non-linear comparator ladder 115 generates a code indicative of the input voltage on the input 105. In one embodiment, the code is a thermometer code, although other embodiments may implement other codes. Compared to a conventional comparator ladder used with a linear resistance ladder, the non-linear comparator ladder 115 may have fewer comparators because non-linear resistance ladder 110 generates fewer voltages than a linear resistance ladder. Consequently, the bit length of the code may be substantially shorter than the bit length of a code from a conventional comparator ladder.

The decreased bit length impacts the amount of digital logic that is implemented to encode the digital output signal. Thus, the inverse non-linear encoder 120 such as a binary encoder may include substantially less digital logic than a conventional linear encoder because there are fewer potential input codes from the non-linear comparator ladder 115.

Moreover, the number of outputs of the inverse non-linear encoder 120 may be independent from the number of comparator signals input to the inverse non-linear encoder 120. In other words, the flash ADC 100 may be a 10 bit ADC (e.g., 1,024 bit combinations) even though the non-linear comparator ladder 115 only outputs, for example, 200 thermometer codes. In this case, the inverse non-linear encoder 120 may have logic to encode the 200 thermometer codes, but may omit logic that would otherwise encode additional thermometer codes.

There are many ways to possibly correlate, in a non-linear manner, the thermometer codes and the binary codes output by the inverse non-linear encoder 120. One way to implement a non-linear correlation to use every code (e.g., 0, 1, 2, 3, . . . ) for a first range of codes, then use every other code (e.g., 100, 102, 104, . . . ) for a subsequent range of codes, then use every third code, then use every forth code, and so on, for the entire range of the ADC. One example of this linearly increasing bit interval sequence is shown in Table 1. Based on 1,024 total bit combinations (i.e., a 10 bit ADC), this exemplary sequence only uses about 260 of the possible bit combinations. Although the encoder logic for this sequence may be similar in size to the encoder logic for an 8 bit ADC, using a 10 bit ADC potentially allows greater code density at the dark parts of the image. Alternatively, an 8 bit ADC may be implemented to provide similar code density.

TABLE 1

Linearly Increasing Bit Interval Sequence

| BIT | BIT INTERVAL | CODE DENSITY |
|---|---|---|
| 0 | 1 | 1.0 |
| 1 | | |
| 2 | | |
| 3 | | |
| . . . | | |
| 100 | 2 | 0.50 |
| 102 | | |
| 104 | | |
| . . . | | |
| 200 | 3 | 0.33 |
| 203 | | |
| 206 | | |
| . . . | | |
| 302 | 4 | 0.25 |
| 306 | | |
| 310 | | |
| . . . | | |
| 402 | 5 | 0.2 |
| 407 | | |
| 412 | | |
| . . . | | |
| 502 | 6 | 0.17 |
| 508 | | |
| 514 | | |
| . . . | | |
| 604 | 7 | 0.14 |
| 611 | | |
| 618 | | |
| . . . | | |
| 702 | 8 | 0.13 |
| 710 | | |
| 718 | | |
| . . . | | |
| 806 | 9 | 0.11 |
| 815 | | |
| 824 | | |

TABLE 1-continued

Linearly Increasing Bit Interval Sequence

| BIT | BIT INTERVAL | CODE DENSITY |
|---|---|---|
| . . . | | |
| 905 | 10 | 0.10 |
| 915 | | |
| 925 | | |
| . . . | | |
| 1024 | | |

Another embodiment of the non-linear flash ADC 100 employs dithering to correlate, in a non-linear manner, the thermometer codes and the binary codes output by the inverse non-linear encoder 120. In particular, dithering may be used to provide a smooth transition between bit ranges using different bit intervals. Table 2 compares two non-linear bit sequences with and without dithering. An "X" indicates whether a specified bit is used or not.

TABLE 2

Non-Linear Bit Sequences With and Without Dithering

| BIT | WITH DITHERING | WITHOUT DITHERING |
|---|---|---|
| . . . | | |
| 90 | X | X |
| 91 | X | X |
| 92 | X | |
| 93 | X | X |
| 94 | X | X |
| 95 | X | X |
| 96 | X | |
| 97 | X | X |
| 98 | X | X |
| 99 | X | |
| 100 | X | X |
| 101 | | X |
| 102 | X | |
| 103 | | X |
| 104 | X | X |
| 105 | | |
| 106 | X | X |
| 107 | | |
| 108 | X | X |
| 109 | | X |
| 110 | X | |
| 111 | | X |
| 112 | X | |
| 113 | | X |
| 114 | X | |
| 115 | | X |
| 116 | X | X |
| 117 | | |
| 118 | X | X |
| 119 | | |
| 120 | X | X |
| . . . | | |

Without dithering, every bit up to 100 is used, and alternating bits are subsequently used. In contrast, dithering creates some overlap between using every bit and every other bit, similar to "feathering" "weaving" the two bit intervals together. Similar dithering techniques may be used to merge other bit interval ranges. Moreover, other techniques may be used to smooth out or otherwise modify the transitions between bit intervals.

In one embodiment, the number of codes may be less because the output signal has less bits than a conventional output signal (e.g., an 8 bit output instead of a 10 bit output).

Alternatively, the number of codes may be less because digital logic is omitted for particular codes, especially the codes corresponding to the bright part of the image. For example, one implementation of the inverse non-linear encoder 120 may omit logic for four out of every five codes where there is a 5 bit interval for the accuracy corresponding to the brightness of the image. In one embodiment, some additional logic may be included to drive multiple input codes to the same output. In general, the amount of digital logic may depend on the bit length of the output signal, the bit interval of the accuracy, and so forth.

Where the inverse non-linear encoder 125 converts the non-linear thermometer code to the digital output code by omitting some of the output codes, the "missing codes" may result in some conversion errors. However, the operation of leaving out some output codes may be done in a controlled way so that the induced error is less than (and insignificant compared to) the noise that is present in the analog input signal on the input 105. In this way, the code density is matched to the noise properties of the signal for readout of the image sensor such that the noise amplitude in the dark parts is substantially lower than in the bright parts. The code density relates to the bit interval because a lower bit interval results in a higher code density, and a higher bit interval results in a lower code density.

Figure 4:
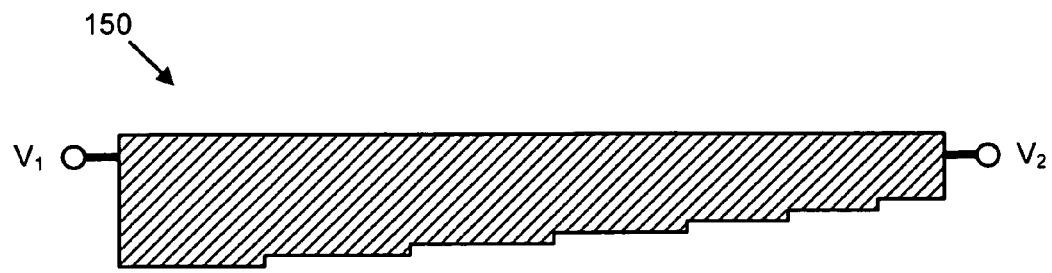
FIG. 4 illustrates an alternative embodiment of a non-linear resistance ladder.

FIG. 4 illustrates an alternative embodiment of a non-linear resistance ladder 150. The depicted non-linear resistance ladder 150 includes several linear portions arranged in a step-wise manner. This arrangement may produce the multi-linear, or piecewise linear, resistance described above. In particular, the non-linear resistance ladder 150 may produce a non-linear resistance having multiple linear portions of distinct linearity.

Figure 5:
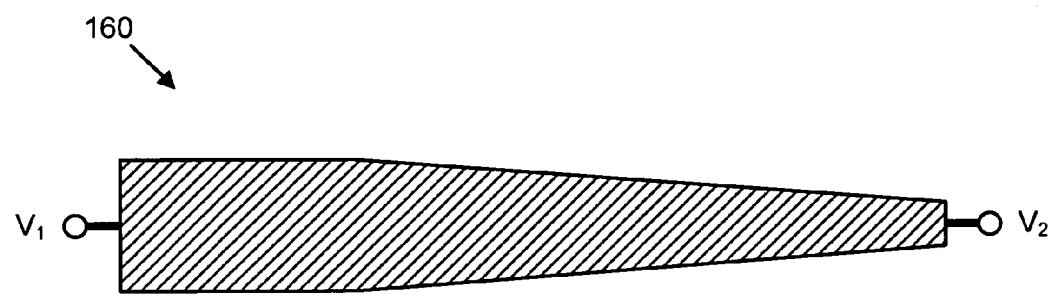
FIG. 5 illustrates another embodiment of a non-linear resistance ladder.

FIG. 5 illustrates another embodiment of a non-linear resistance ladder 160. The depicted non-linear resistance ladder 160 includes a first linear portion and a second tapered portion. Although the tapered portion is tapered linearly, the tapered portion alternatively may have a curvi-linear geometry.

Figure 6:
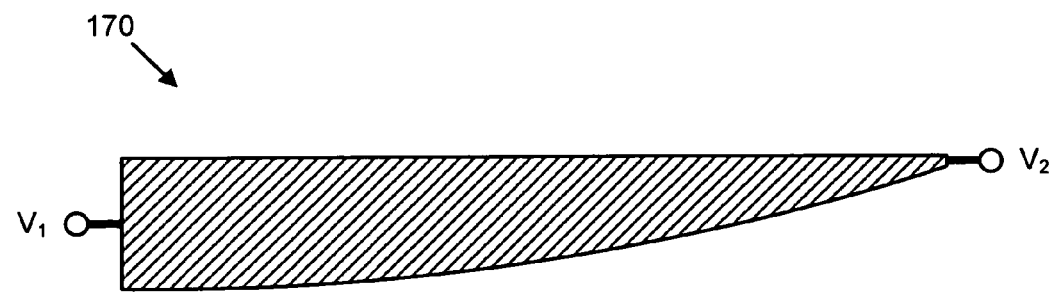
FIG. 6 illustrates another embodiment of a non-linear resistance ladder.

FIG. 6 illustrates another embodiment of a non-linear resistance ladder 170. The depicted non-linear resistance ladder 170 includes one linear edge and one non-linear edge. Although certain geometries of non-linear resistance ladders 110, 150, 160, and 170 are shown, other embodiments may include alterations to the length, width, thickness, or other characteristics of the non-linear resistance ladder 110.

Figure 7:
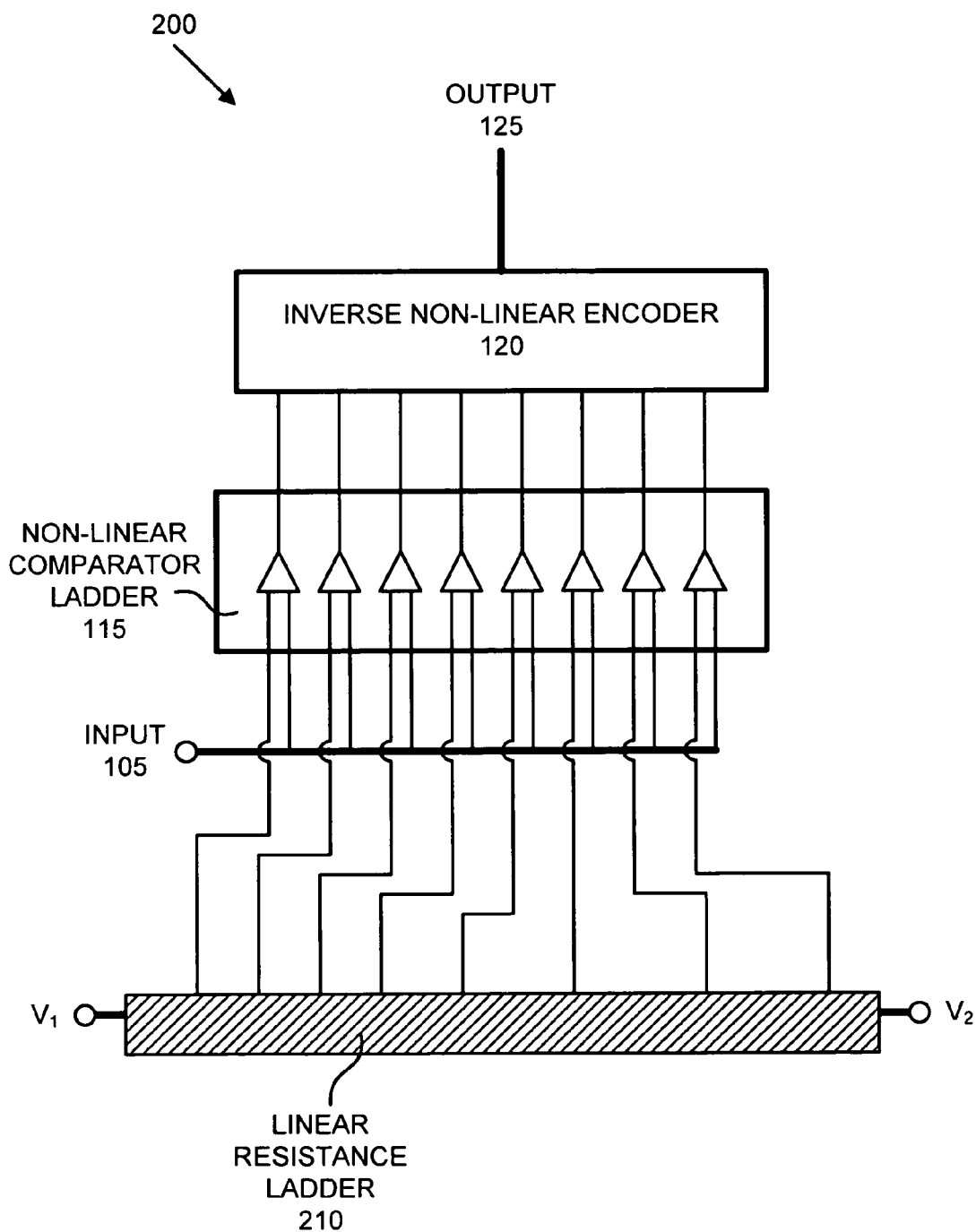
FIG. 7 illustrates an alternative embodiment of a non-linear flash ADC.

FIG. 7 illustrates an alternative embodiment of a non-linear flash ADC 200. Many aspects of the depicted non-linear flash ADC 200 are similar to the non-linear flash ADC 100 of FIG. 3. However, the non-linear flash ADC of FIG. 7 includes a linear resistance ladder 210 instead of a non-linear resistance ladder 110. Although the physical geometry of the linear resistance ladder 210 may be similar to a conventional linear resistance ladder, the linear resistance ladder 210 is configured to generate non-linear voltages.

In one embodiment, the linear resistance ladder 210 generates non-linear voltages because of the tap locations of the individual voltage outputs. For example, unequally spaced output taps may correspond to a non-linear relationship between the resulting output voltages. In contrast, equally spaced output taps may correspond to a linear relationship between the resulting output voltages. Each combination of equally and/or unequally spaced output taps generates a unique set of output voltages. In one embodiment, the output taps may be spaced close together at low voltages (corresponding to dark parts of an image) and spaced farther apart at high voltages (corresponding to bright parts of an image).

Figure 8:
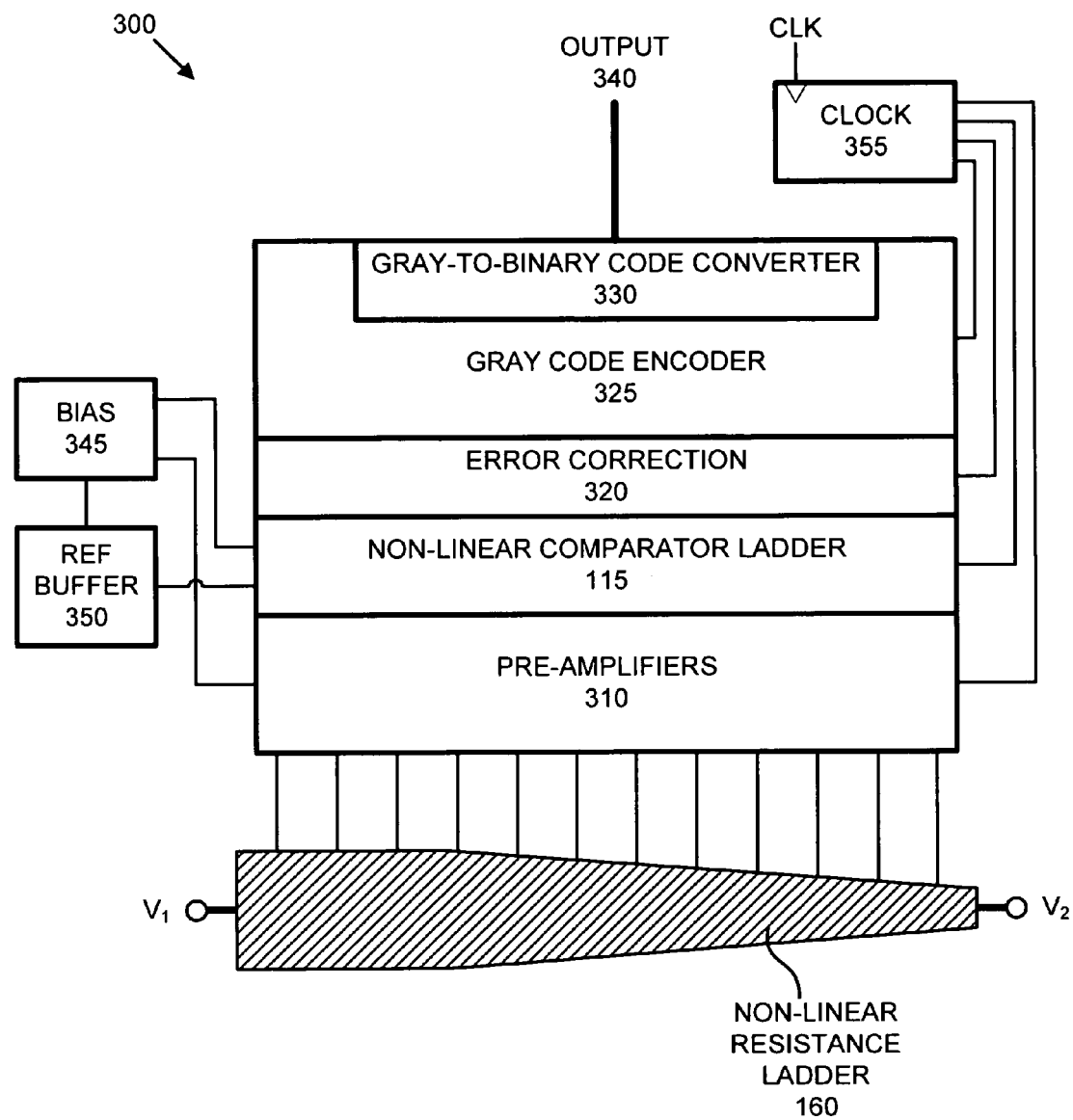
FIG. 8 illustrates another embodiment of a non-linear flash ADC.

FIG. 8 illustrates another embodiment of a non-linear flash ADC 300. For clarity, the input line 105 is omitted from FIG. 8. The depicted non-linear flash ADC 300 includes a non-linear resistance ladder 160, pre-amplifiers 310, a non-linear comparator ladder 115, error correction logic 320, a gray code encoder 325, a gray-to-binary (G2B) code converter 330, and an output 340. The flash ADC 300 also includes a bias source 345, a reference buffer 350, and a clock 355.

In one embodiment, the non-linear resistance ladder 160 generates non-linear voltages. The pre-amplifiers 310 amplify the non-linear voltages according to pre-amplification technology known in the art. Accordingly, the pre-amplifiers 310 are not described in more detail herein. The non-linear comparator ladder 115 compares each of the non-linear voltages with an input voltage from an image sensor. In one embodiment, the bias source 345 provides a bias signal to the pre-amplifiers 310 and the non-linear comparator ladder 115, as well as the reference buffer 350. Additionally, the reference buffer 350 is coupled to the non-linear comparator ladder 115. Furthermore, the clock 355 supplies one or more clock signals to the components of the non-linear flash ADC 300. In this way, the non-linear flash ADC 300 may be synchronized in its operation.

In one embodiment, the error correction logic 320 implements error correction operations to ensure the integrity of the signals from the non-linear comparator ladder 115. The error correction logic 320 implements error correction technology known in the art. Accordingly, the error correction logic 320 is not described in more detail herein.

The gray code encoder 325 is an alternative type of inverse non-linear encoder 120, instead of a binary encoder. The gray code encoder 325 encodes the thermometer signal from the non-linear comparator ladder 115 as a gray code using gray code encoding technology known in the art. Similarly, the gray-to-binary code converter logic 330 implements signal conversion technology known in the art to convert a gray code to a binary code. Accordingly, the gray code encoder 325 and the gray-to-binary code converter logic 330 are not described in more detail herein.

Figure 9:
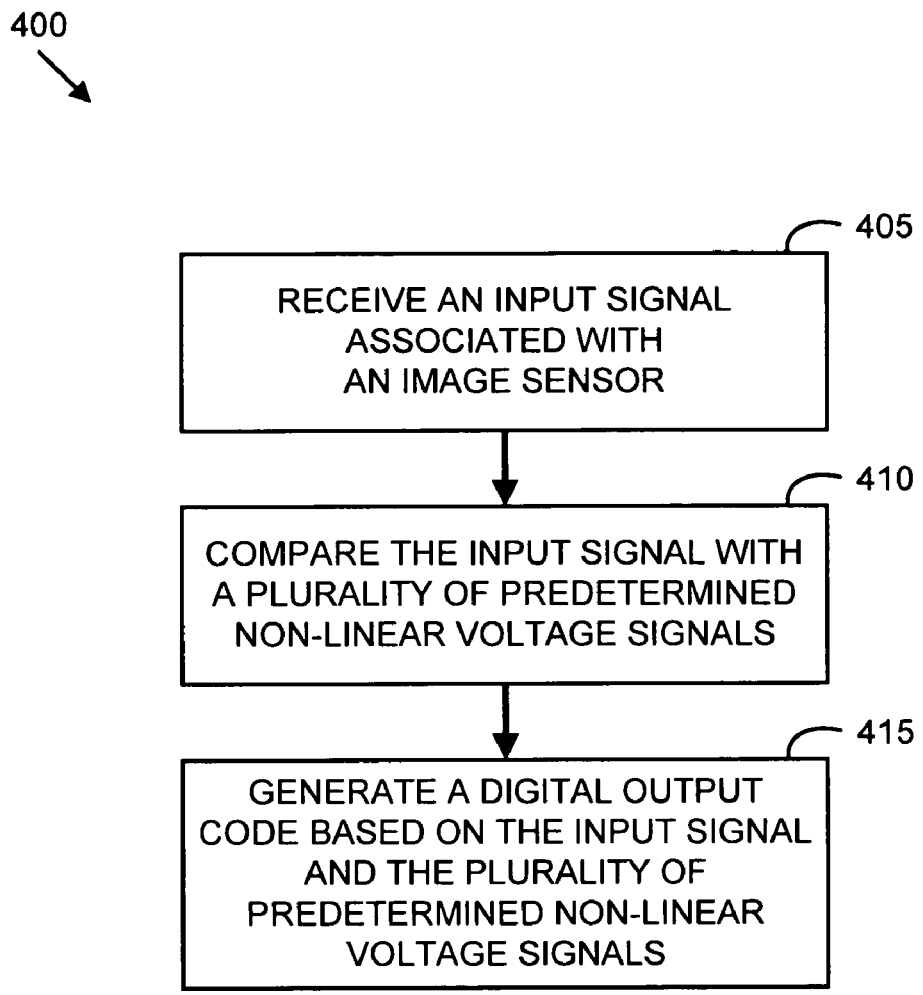
FIG. 9 illustrates a flow chart of one embodiment of a non-linear ADC method which may be implemented with a non-linear flash ADC.

FIG. 9 illustrates a flow chart of one embodiment of a non-linear ADC method 400 which may be implemented with a non-linear flash ADC 100. Although the non-linear ADC method 400 is described with respect to one embodiment of the non-linear flash ADC 100, other embodiments of the non-linear flash ADC 100 also may implement the non-linear ADC method 400.

In one embodiment, the non-linear flash ADC 100 receives 405 an input signal associated with an image sensor. The input signal is present on the input 105. The non-linear comparator ladder 115 then compares 410 the input signal with a plurality of predetermined non-linear voltage signals. In one embodiment, the input signal is an analog input voltage from a photodiode. The non-linear resistance ladder 110 may generate the non-linear voltage signals, as described above. Subsequently, the inverse non-linear encoder 120 generates 415 a digital output code based on the input signal and the plurality of predetermined non-linear voltage signals. In one embodiment, the digital output code may be a binary code. In another embodiment, the digital output code may be a gray code. Alternatively, other codes may be used. The depicted non-linear ADC method 400 then ends.

Figure 10:
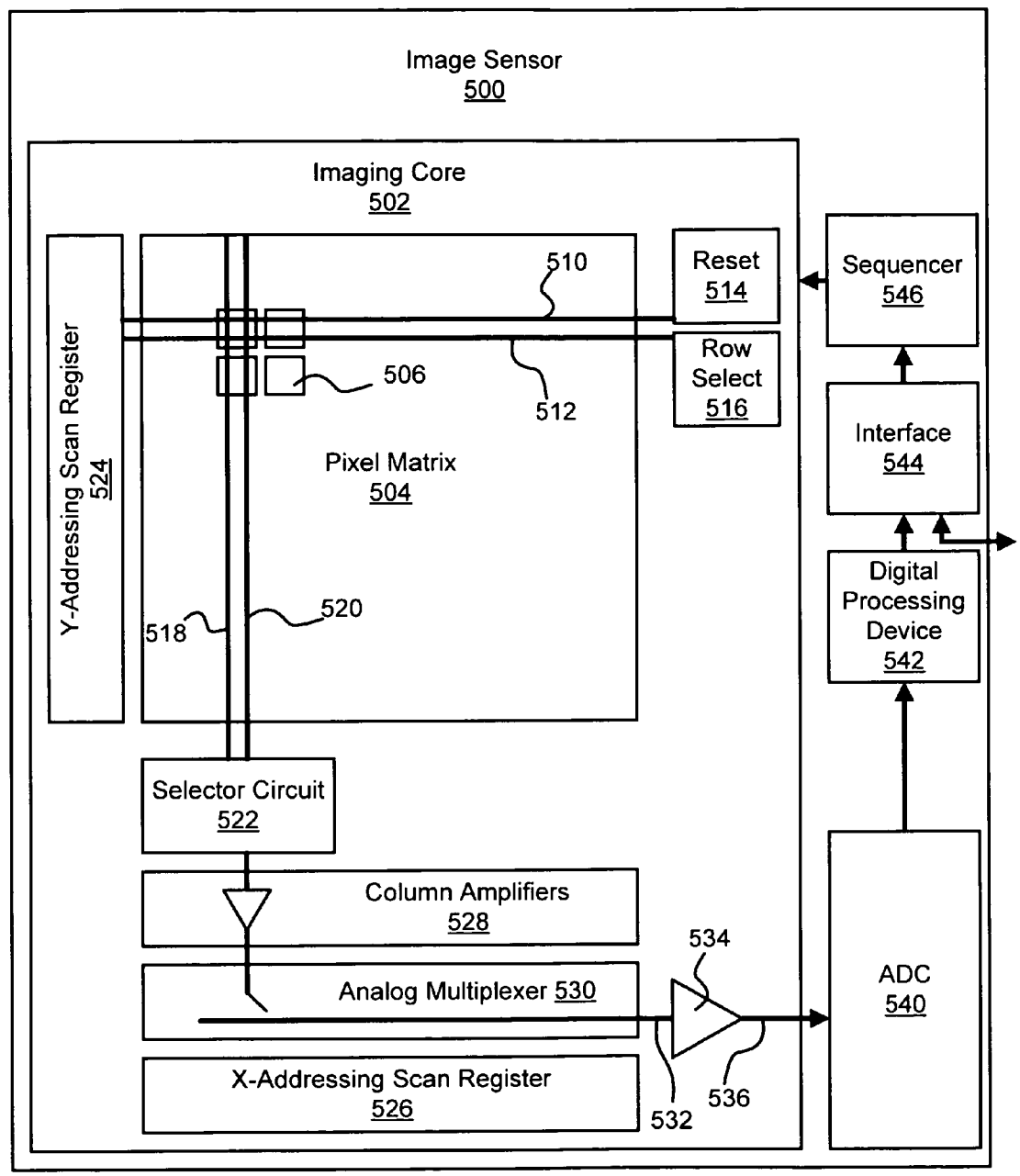
FIG. 10 illustrates one embodiment of an active pixel image sensor.

FIG. 10 illustrates one embodiment of an active pixel image sensor 500. The active pixel image sensor 500 is also shown and described in the context of an imaging system in FIG. 11. In one embodiment, the image sensor 500 is a color complimentary metal-oxide semiconductor (CMOS) image sensor. However, other types of image sensors may be used. For example, the image sensor 500 may be another type of metal-oxide semiconductor (MOS) image sensor. The illustrated image sensor 500 includes an imaging core 502 which includes a pixel matrix 504 and electronic components (imaging electronics) associated with the operation of the imaging core 502. In one embodiment, the imaging core 502 includes a pixel matrix 504 having an array of pixel circuits 506 (also referred to as pixels 506) and the corresponding driving and sensing circuitry for each pixel 506. In general, the pixels 506 are known in the art and are not described in more detail herein.

The pixel matrix 504 may be arranged in M columns of pixels 506 by N rows of pixels 506. In one embodiment, each pixel 506 has a width and a length, and includes at least a photosensitive element and a readout switch. In certain embodiments, the pixels 506 of the pixel matrix 504 may be linear response pixels (i.e., having linear or piecewise linear slopes).

Each row of pixels 506 is coupled to a reset line 510 and a row select line 512 (also referred to as a select line). The reset line 510 is coupled to a reset supply 514, which resets the voltage of the pixels 506. Similarly, the row select line 512 is coupled to a row select supply 516, which selects a row of pixels 506 to be read out. Additionally, each column of pixels 506 is coupled to a source column 518 and a readout column 520 (also referred to as a readout line). In one embodiment, the source column 518 provides an activation signal the pixel 506, and the readout column 520 provides an electrical conduit to read out an integration voltage from the pixel 506. In certain embodiments, the source column 518 and the readout column 520 are coupled to a selector circuit 522, although other embodiments of the image sensor 500 may omit the selector circuit 522. In other embodiments, each pixel 506 within a row may be coupled to other circuitry that couples one or more pixels 506, rows, or columns.

In one exemplary embodiment, the pixel array 504 may have approximately 2,000 columns by 1,500 rows of pixels 506. Each pixel 506 may be an adaptive dynamic range photodiode that is, for example, approximately 3.35 µm by 3.35 µm in size. The resulting pixel array 504 for this size of pixel 506 is about 6.75 mm by 5.08 mm in size. In other embodiments, the pixel array 504 may have more or less pixels 506, rows, or columns, or include other types and/or sizes of pixels 506.

One exemplary sequence of operation of the pixel circuit 506 is as follows: reset, integration, readout, reset, etc. During the reset period, the pixel circuit 506 establishes a known, baseline voltage. During the integration period, the pixel circuit 506 establishes a voltage relative to the light incident on the pixel circuit 506. During the readout period, the pixel circuit 506 transfers the integration voltage (or a voltage from which the integration voltage may be derived) to the readout column 520 for processing. The pixel circuit 506 may continue in this operational sequence while the pixel matrix 504 is being used to generate one or more images. Alternatively, the pixel circuit 506 may be used in another manner.

In certain embodiments, the driving and sensing circuitry of the imaging core 502 includes one or more Y-addressing scanning registers 524 and one or more X-addressing scanning registers 526 in the form of shift registers or addressing registers. The circuitry of the imaging core 502 also may include buffers and/or line drivers (not shown) for the long reset and select lines. The circuitry of the imaging core 502 also may include column amplifiers 528 that may contain fixed pattern noise (FPN) cancellation and double sampling circuitry (not shown) such as correlated double sampling (CDS) circuitry. In one embodiment, the CDS circuitry is on-chip. The circuitry of the imaging core 502 also may include an analog multiplexer 530 coupled to an output bus 532.

In one embodiment, the Y-addressing scan register 524 addresses via the row select line 512 all of the pixels 506 of a row of the pixel matrix 504 to be read out. In this way, all of the switching elements of the pixels 506 of the selected row may be closed at approximately the same time to place a signal on a corresponding number of readout columns 520. The individual signals are subsequently amplified in the column amplifiers 528. Similarly, one or more filters may be used to improve the integrity of the signal.

In one embodiment, the X-addressing scan register 526 provides control signals to the analog multiplexer 530 to place an output signal (e.g., amplified charges) of the column amplifiers 528 onto the output bus 532. The output bus 532 may be coupled to an output buffer 534 that provides an analog output 536 from the imaging core 502. In another embodiment, additional amplifiers and/or filters (not shown) may enhance the output signal 536 after it has been transmitted from the analog multiplexer 530.

In the depicted embodiment, the output signal 536 from the imaging core 64 is coupled to an analog-to-digital converter (ADC) 540 to convert the analog imaging core output 536 into the digital domain. In one embodiment, the ADC 540 is a non-linear flash ADC 100 or another type of non-linear flash ADC. As on example, the ADC 540 may be an on-chip 12-bit column parallel ADC. The output of the ADC 540 is coupled to a digital processing device 542 to process the digital data received from the ADC 540. Such processing may be referred to as imaging processing or post-processing.

The digital processing device 542 may include one or more general-purpose processing devices such as a microprocessor or central processing unit, a controller, or the like. Alternatively, the digital processing device 542 may include one or more special-purpose processing devices such as a digital signal processor (DSP), an application specific integrated circuit (ASIC), a field programmable gate array (FPGA), or the like. In an alternative embodiment, for example, the digital processing device 92 may be a network processor having multiple processors including a core unit and multiple microengines. Additionally, the digital processing device 542 may include any combination of general-purpose processing device(s) and special-purpose processing device(s).

In one embodiment, the digital processing device 542 is coupled to an interface module 544 that handles the input/output (I/O) exchange with other components of an imaging system. The interface module 544 also may manage other tasks such as protocols, handshaking, voltage conversions, and so forth.

In one embodiment, the interface module 544 is coupled to a sequencer 546. Additionally, the sequencer 546 may be coupled to one or more components in the image sensor 500 such as, for example, the imaging core 502, the digital processing device 542, and the ADC 540. The sequencer 546 may be a digital circuit that receives externally generated clock and control signals via the interface module 544 and generates internal pulses to drive circuitry (for example, the imaging core 502, the ADC 540, etc.) in the imaging sensor 500.

Although a particular embodiment of the image sensor 500 is described herein, other embodiments of the image sensor 500 may differ from the depicted embodiment in size, components, layout, and so forth. For example, an alternative embodiment of the image sensor 500 may include one ADC 540 for every pixel 506, for every column, or for a subset block of columns. Similarly, one or more other components within the image sensor 500 may be duplicated and/or reconfigured for parallel or enhanced performance. Similarly, the layout of the individual components within the image sensor 500 may be modified to adapt to the number and type of components. In another embodiment, some of the operations performed by the image sensor 500 may be performed in the digital domain instead of the analog domain, and vice versa. One skilled in the art understands that these alternative embodiments are all within the scope of this description.

Additionally, the pixel matrix 504 and associated imaging electronics within the imaging core 502 each may reside on a different die substrate and in different chip packages. Alternatively, the electronic components within the imaging core 502 may reside in a common chip package on separate integrated circuit die substrates or on a common die substrate.

Figure 11:
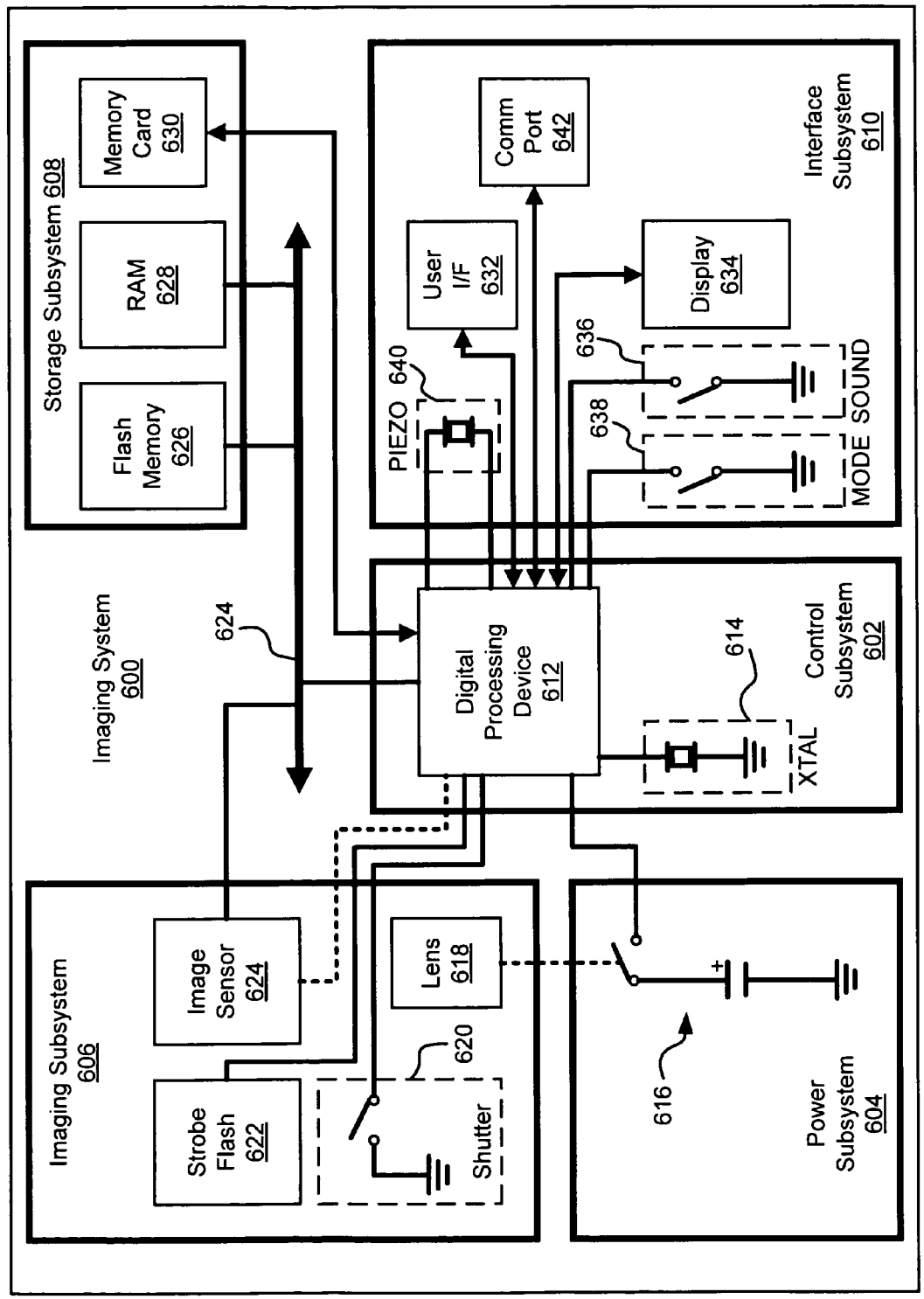
FIG. 11 illustrates one embodiment of an imaging system.

FIG. 11 illustrates one embodiment of an imaging system 600. The imaging system 600 is representative of various imaging systems that may be incorporated in one or more types of imaging devices, including still cameras, video cameras, scanners, automotive cameras, and so forth. For convenience, the imaging system 600 may be referred to as a camera, but is nevertheless understood to be representative of other types of imaging systems.

The illustrated imaging system 600 includes a control subsystem 602, a power subsystem 604, an imaging subsystem 606, a storage subsystem 608, and an interface subsystem 610. Although each of these subsystems is described herein with particular detail, other embodiments of the imaging system 600 may include fewer or more subsystems and/or fewer or more component parts of the individual subsystems.

In one embodiment, the control subsystem 602 includes a digital processing device 612. The digital processing device 612 may be may include one or more general-purpose processing devices such as a microprocessor or central processing unit, a controller, or the like. Alternatively, the digital processing device 612 may include one or more special-purpose processing devices such as a digital signal processor (DSP), an application specific integrated circuit (ASIC), a field programmable gate array (FPGA), or the like. Additionally, the digital processing device 612 may include any combination of general-purpose processing device(s) and special-purpose processing device(s). In an alternative embodiment, for example, the digital processing device 612 may be a network processor having multiple processors including a core unit and multiple microengines. In the illustrated embodiment, the digital processing device 612 is an ASIC, but references to the ASIC 612 herein are understood to be representative of the digital processing device 612, generally.

The digital processing device 612 may include a microprocessor, one or more memory devices, control logic, and the like, in order to implement particular operations within imaging system 600. For example, the digital processing device 612 may facilitate taking a digital picture, including acquiring an image via the imaging subsystem 606, digitizing the image, processing the image, displaying the image via the interface subsystem 610, storing the image via the storage subsystem 608, and transferring the image to an external storage device (not shown). Similarly, the digital processing device 612 may implement instructions from a user received via the interface subsystem 610. In one embodiment, the digital processing device 612 also may include an internal read-only memory (ROM) for firmware storage. Furthermore, the digital processing device 612 may facilitate firmware or software updates within the imaging system 600. The control subsystem 602 also may include a quartz crystal 614, oscillator, or other clocking device to supply a clock signal to the digital processing device 612.

In one embodiment, the power subsystem 604 includes a battery circuit 616 to supply electrical power to the digital processing device 612 and other subsystems within the imaging system 600. The power subsystem 604 may include a permanent battery, temporary batteries, a recharging circuit, regulators or other current control circuitry, one or more switches, and so forth. In another embodiment, the power subsystem 604 may include a power adapter to accept alternating current (AC) or direct current (DC) power from an external power supply (not shown). In another embodiment, the power subsystem 604 may be configured to accept power via a universal serial bus (USB) port, or other communication port, whenever the imaging system 600 is plugged into a PC or other computing device.

In one embodiment, the imaging subsystem 606 includes a lens assembly 618 having one or more optical lenses, a shutter 620, a strobe flash 622, and the image sensor 500. The imaging subsystem 606 captures images and converts them into digital form. In one embodiment, the image sensor 500 may be coupled to a bus 624 which is coupled to the digital processing device 612. One example of the image sensor 500 is depicted and described in more detail with reference to FIG. 10.

The lens assembly 618 directs incident light to a pixel array 504 within the image sensor 500. In one example, the lens assembly 618 may include a lens stack integrated with the image sensor 500. In another embodiment, the lens assembly 618 may have other characteristics. The shutter 620 allows the light to be detected by the image sensor 500. The strobe flash 622 provides additional light, in addition to any ambient light, to illuminate a scene approximately during the time the image sensor 500 detects an image. In one example, the strobe flash 622 automatically activates in response to detected low light levels. In other embodiments, lens assemblies, shutters, and flashes that are generally known in the art may be suitable for use with the imaging system 600, although more specialized or custom devices also may be used with the imaging system 600.

In one embodiment, the storage subsystem 608 includes a flash memory device 626, a random access memory (RAM) device 628, and a memory card 630. Although a flash memory 626 is shown, other types of memory, including read-only memory (ROM), programmable ROM (PROM), erasable PROM (EPROM), and electrically erasable PROM (EEPROM), may be used in conjunction with or in place of the flash memory 626. Alternatively, other types of memory may be used. The flash memory 626 and the RAM 628 may be coupled to the bus 624. The digital processing device 612 may coordinate bus arbitration and the transfer of image data from the imaging subsystem 606 to the storage subsystem 608. The RAM 628 may be nonvolatile and store software or other control instructions that are used by the digital processing device 612 to operate the imaging system 600.

For example, the digital processing device 612 may load firmware instructions from an internal ROM into the RAM 628. In one example, the RAM 628 is synchronous RAM (SRAM). In another embodiment, the RAM 628 is synchronous dynamic RAM (SDRAM). Alternatively, the RAM 628 may be another type of volatile or nonvolatile RAM.

The flash memory 626 or the RAM 628 may store images and/or image metadata (e.g., image capture parameters, camera mode settings, electrical power settings, etc.) from the imaging subsystem 606, for example. In one embodiment, the image data is initially stored in the RAM 628 and then transferred to the flash memory 626 for more permanent storage. The digital processing device 612 may initiate a direct memory transfer (DMA) to transfer the image data from the RAM 628 to the flash memory 626. The microprocessor within the digital processing device 612 may include several DMA engines to perform the DMA operations. In certain embodiments, the DMA engines may facilitate the following transfers: imaging subsystem 606 to RAM 628, RAM 628 to flash memory 626, flash memory 626 to RAM 628, RAM 628 to memory card 630, memory card 630 to RAM 628, and so forth. In one embodiment, the flash memory 626 is NAND flash memory ranging in size from 4 to 32 megabytes (MB), although other types and/or sizes of flash memory 626 may be used.

The memory card 630 is a memory card such as a secure digital (SD) memory card, a mini SD card, an ultra-compact (xD) memory card, a multimedia card (MMC), a microdrive, a universal serial bus (USB) flash drive, or another type of removable or non-removable memory media. In one embodiment, the memory card 630 may be permanently coupled to the storage subsystem 608.

In one embodiment, the interface subsystem 610 includes a user interface (I/F) module 632, a display device 634, one or more sound modules 636, one or more mode modules 638, a piezo buzzer module 640 (also known as a piezo resonator), and a communication port 642. The user interface module 632 may include hardware components such as buttons, as well as accompanying software, to allow a user to interface with the imaging system 600. In particular, the user interface module 632 may allow a user to make selections regarding the operation of the imaging system 600, the use of the strobe flash 622 and other capture parameters, the location of stored images on the storage subsystem 608, and so forth. Additionally, the interface subsystem 610 may be partially or wholly configurable by the firmware.

The display device 634 communicates visual images, including digitized images from the imaging subsystem 606, user selection menus, status indicators, and so forth, to the user. In one embodiment, the display device 634 is a liquid crystal display (LCD) such as a thin film transistor (TFT) display. In another embodiment, the display device 634 may employ another technology to generate and present an image to the user. The sound module 636 controls sounds produced by the imaging system 600. The mode module 638 controls the operational mode of the imaging system 600. For example, the imaging system 600 may have various capture modes, including bright, dark, far, near, action, portrait, and so forth. The buzzer module 640, in one embodiment, is a piezo resonator to produce variable pitch tones.

The communication port 642 allows connectivity with another electronic device such as a desktop computer (not shown) or other computing device. In the illustrated embodiment, the communication port 642 is a USB port, but references to the USB port 642 herein are understood to refer to the communication port 642, generally. In one embodiment, the communication port 642 may be used to provide power to recharge a battery in the power subsystem 604, transfer images and image metadata from the storage subsystem 608 (e.g., the flash memory 626 or the memory card 630) to a desktop computer, for example, and communicate firmware upgrades from the desktop, for example, to the digital processing device 612. In one example, the communication port 642 may be a USB 2.0 port.

The electronic components of the imaging system 600 each may reside on a different die substrate and in different chip packages. Alternatively, some or all of the electronic components of the imaging system 600 may reside in a common chip package on separate integrated circuit die substrates or on a common die substrate.

The image sensor 500 discussed herein may be used in various applications. For example, embodiments of the image sensor 500 may be used in a digital camera system for general-purpose photography (e.g., camera phone, still camera, video camera) or special-purpose photography. In other embodiments, the image sensor 500 may be used in other types of applications. For example, embodiments of the image sensor 500 may be used in machine vision, document scanning, microscopy, security, biometry, and other similar applications.

Advantages of embodiments of the non-linear flash ADC 100 described herein include, but are not limited to, smaller size and less power consumption. Additionally, other embodiments are capable of behaving like a linear ADC, with least significant bit (LSB) accuracy matched to input signal noise.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved solution and the methods of designing and manufacturing the same that are widely known and are not relevant to the present invention have been omitted from the following description. Although the operations of the method(s) herein are shown and described in a particular order, the order of the operations of each method may be altered so that certain operations or performed in an inverse order or so that certain operation may be performed, at least in part, concurrently with other operations. In another embodiment, instructions or sub-operations of distinct operations may be in an intermittent and/or alternating manner.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention. Similarly, it should be appreciated that in the foregoing description of exemplary embodiments of the invention, various features of the invention are sometimes grouped together in a single embodiment, figure, or description.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
a non-linear resistance ladder having an input and a plurality of non-linear voltage outputs, the non-linear resistance ladder having a single discrete geometry with multiple portions of distinct resistance;
a non-linear comparator ladder coupled to the plurality of non-linear voltage outputs of the non-linear resistance ladder, wherein the non-linear comparator ladder comprises a bank of comparators to compare an input signal to each of a plurality of non-linear voltage signals corresponding to the plurality of non-linear voltage outputs; and
an inverse non-linear encoder coupled to the non-linear comparator ladder to generate a digital output code based on the input signal and the plurality of non-linear voltage signals.

2. The apparatus of claim 1, wherein the inverse non-linear encoder comprises a binary encoder.

3. The apparatus of claim 1, wherein the inverse non-linear encoder comprises a Gray code encoder and a Gray-to-binary code converter.

4. The apparatus of claim 1, further comprising first and second voltage inputs coupled to the non-linear resistance ladder to generate the plurality of non-linear voltage signals, wherein the input signal comprises an image sensor readout voltage, and a plurality of comparator output signals comprise a non-linear thermometer code.

5. The apparatus of claim 4, wherein the digital output signal of the inverse non-linear encoder comprises a digital representation of the non-linear thermometer code.

6. The apparatus of claim 1, further comprising a bank of preamplifiers coupled between the non-linear resistor and the non-linear comparator ladder.

7. The apparatus of claim 6, wherein the bank of comparators, the bank of preamplifiers, and the inverse non-linear encoder share a common clock signal.

8. The apparatus of claim 1, wherein the apparatus comprises an analog-to-digital converter flash architecture.

9. An apparatus, comprising:
a non-linear resistance ladder having an input and a plurality of non-linear voltage outputs;
a non-linear comparator ladder coupled to the plurality of non-linear voltage outputs of the non-linear resistance ladder, wherein the non-linear comparator ladder comprises a bank of comparators to compare an input signal to each of a plurality of non-linear voltage signals corresponding to the plurality of non-linear voltage outputs; and
an inverse non-linear encoder coupled to the non-linear comparator ladder to generate a digital output code based on the input signal and the plurality of non-linear voltage signals, wherein a code density of the digital output code is approximately matched to noise properties of the input signal, the noise properties characterizing a low noise amplitude associated with a dark part of an image and a high noise amplitude associated with a light part of the image.

10. An apparatus, comprising:
a non-linear resistance ladder having an input and a plurality of non-linear voltage outputs;
a non-linear comparator ladder coupled to the plurality of non-linear voltage outputs of the non-linear resistance ladder, wherein the non-linear comparator ladder comprises a bank of comparators to compare an input signal to each of a plurality of non-linear voltage signals corresponding to the plurality of non-linear voltage outputs;
an inverse non-linear encoder coupled to the non-linear comparator ladder to generate a digital output code based on the input signal and the plurality of non-linear voltage signals;
a bank of preamplifiers coupled between the non-linear resistor and the non-linear comparator ladder, wherein the bank of comparators, the bank of preamplifiers, and the inverse non-linear encoder share a common clock signal; and
an error correction block coupled between the non-linear comparator ladder and the inverse non-linear encoder.

11. The apparatus of claim 10, further comprising:
a reference buffer coupled to the non-linear comparator ladder; and
a bias voltage source coupled to the bank of preamplifiers and the non-linear comparator ladder.

12. A method, comprising:
receiving an input signal associated with an image sensor readout;
comparing the input signal with each of a plurality of non-linear voltage signals;
generating a digital output code based on the input signal and the plurality of non-linear voltage signals; and
generating the plurality of non-linear voltage signals from a non-linear resistance ladder, wherein the plurality of non-linear voltage signals comprise a dithered subset of a plurality of linear voltage steps equally distributed over a voltage range.

13. The method of claim 12, further comprising generating a non-linear thermometer code based on the comparison of the input signal with each of the plurality of non-linear voltage signals.

14. The method of claim 12, wherein a voltage difference between consecutive voltage signals of the plurality of non-linear voltage signals is greater than a noise component of the input signal.

* * * * *